United States Patent
Frake et al.

(10) Patent No.: US 6,559,715 B1
(45) Date of Patent: May 6, 2003

(54) LOW PASS FILTER

(75) Inventors: Scott O. Frake, Cupertino, CA (US); Jason R. Bergendahl, Campbell, CA (US)

(73) Assignee: Xilinx, Inc., San Jose, CA (US)

( * ) Notice: Subject to any disclaimer, the term of this patent is extended or adjusted under 35 U.S.C. 154(b) by 195 days.

(21) Appl. No.: 09/618,204

(22) Filed: Jul. 18, 2000

Related U.S. Application Data

(60) Provisional application No. 60/149,366, filed on Aug. 13, 1999.

(51) Int. Cl.[7] ............................................. H03K 5/00
(52) U.S. Cl. ...................................... 327/558; 327/552
(58) Field of Search ................................ 327/552–559, 327/540, 437, 55, 532, 311, 344, 427

(56) References Cited

U.S. PATENT DOCUMENTS

| | | | |
|---|---|---|---|
| 4,774,421 A | | 9/1988 | Hartmann et al. ........... 364/716 |
| 5,999,039 A | * | 12/1999 | Holst et al. ................... 327/532 |
| 6,018,265 A | * | 1/2000 | Keshtbod ...................... 327/540 |
| 6,037,808 A | * | 3/2000 | Houston et al. ............... 327/55 |
| 6,078,197 A | * | 6/2000 | Kawano ....................... 327/108 |
| 6,111,606 A | * | 8/2000 | Ikeda .......................... 348/241 |

OTHER PUBLICATIONS

Raul R. Gray and Robert G. Meyer, "Analysis and Design of Analog Integrated Circuits, Second Edition" published by John Wiley & Sons, 1984, pp. 736–737.

Paul Horowitz and Winfield Hill, "The Art of Electronics, Second Edition" published by Cambridge University Press, 1989, pp. 307–312.

\* cited by examiner

*Primary Examiner*—Dinh T. Le
(74) *Attorney, Agent, or Firm*—Jeanette S. Harms; Edel M. Young; Scott R. Brown

(57) ABSTRACT

A low pass filter (LPF) is provided that smoothes and significantly slows any change in its input voltage. The capacitance of the LPF is provided by an NMOS transistor having its source and drain tied to ground. The resistance of the LPF is provided by a plurality of series-connected PMOS transistors. The gates of the PMOS transistors are coupled to ground and therefore these transistors are conducting. The PMOS transistors are fabricated in a floating well. Therefore, the LPF eliminates any capacitive coupling between a voltage supply and the well. Thus, any variation in the supply voltage fails to affect adversely the functioning of the PMOS transistors. Thus, the LPF of the present invention can advantageously smooth and significantly slow any change in its input voltage. In one embodiment, the input voltage is a reference voltage. In this manner, a voltage regulator, which receives the filtered reference voltage from the LPF, in turn provides a significantly more constant regulated voltage to the internal circuits of the IC. Thus, the present invention advantageously minimizes the possibility of a malfunction in a digital system due to a variation in the regulated voltage.

7 Claims, 5 Drawing Sheets

LOW PASS FILTER

RELATED APPLICATION

This application claims priority to U.S. provisional application Ser. No. 60/149,366 entitled "Low Pass Filter" filed Aug. 13, 1999.

BACKGROUND OF THE INVENTION

1. Field of the Invention

The present invention relates to a low pass filter, and in particular to a low pass filter used to smooth variations in a voltage provided to a voltage regulator.

2. Discussion of the Related Art

Voltage regulators are well known in the art of integrated circuits (ICs). A voltage regulator is a device that takes an input voltage and conditions it to provide a better-controlled output voltage. This conditioning is important, particularly if the input voltage fluctuates. Specifically, a voltage regulator is often used to ensure that a relatively constant regulated voltage is provided to the voltage-sensitive internal circuits of the IC.

Some of these circuits are especially sensitive to variations in the regulated voltage. One such circuit is the delay locked loop (DLL) in the Virtex™ field programmable gate array (FPGA) sold by Xilinx, Inc. DLLs are used in digital systems to minimize clock skew. DLLs typically use delay elements to synchronize the active edges of a reference clock signal in one part of the system with a feedback clock signal from a second part of the system. A detailed description of the Virtex DLL is provided in U.S. patent application Ser. No. 09/102,740, entitled "Delay Lock Loop With Clock Phase Shifter", filed on Jun. 22, 1998 and incorporated by reference herein.

An abrupt change in the regulated voltage to a DLL would contribute to DLL output jitter, or possibly loss of lock, both of which are highly undesirable. Specifically, any clock skew not corrected by the DLL can cause a digital system to malfunction. Therefore, a need arises for a way to minimize abrupt changes in the regulated voltage provided by the voltage regulator.

SUMMARY OF THE INVENTION

In accordance with one embodiment of the present invention, a low pass filter (LPF) is provided between a reference voltage circuit and the voltage regulator. The LPF smoothes and significantly slows any change in the reference voltage, which in turn eliminates any abrupt change in the regulated voltage. Thus, the present invention advantageously minimizes the possibility of a malfunction in a digital system due to a variation in the regulated voltage.

The LPF of the present invention includes a circuit having both a resistance and a capacitance. In one embodiment, the resistance (R) of the LPF is provided by a plurality of series-connected PMOS transistors. In another embodiment, a single PMOS transistor is used. In either embodiment, the gate of each PMOS transistor is coupled to ground and therefore each PMOS transistor is conducting. In this configuration and with appropriate sizing, the PMOS transistor (s) will form a large resistor. The capacitance (C) of the LPF is provided by an NMOS transistor having its source and drain tied to ground. In this configuration, the NMOS transistor forms a capacitor. The NMOS transistor is coupled to the PMOS transistor(s) to form the RC circuit which implements the LPF.

Of importance, each PMOS transistor in the LPF of the present invention is fabricated in a floating well. Therefore, the LPF of the present invention eliminates any capacitive coupling between a voltage supply and the well. In this manner, any variation in the supply voltage fails to affect adversely the output voltage of the LPF. Thus, the LPF of the present invention can advantageously smooth and significantly slow any change in the reference voltage. The voltage regulator, which receives the filtered reference voltage, in turn provides a significantly more constant regulated voltage to the internal circuits of the IC.

In one embodiment of the present invention, the source and drain terminals of a bypass transistor are coupled to either side of the series-connected PMOS transistors. During power-up, this bypass transistor is turned on, thereby allowing the voltage regulator to see immediately the reference voltage. After power-up is completed, the bypass transistor is turned off, thereby ensuring that the LPF filters the reference voltage.

DETAILED DESCRIPTION OF THE DRAWINGS

Figure 1:
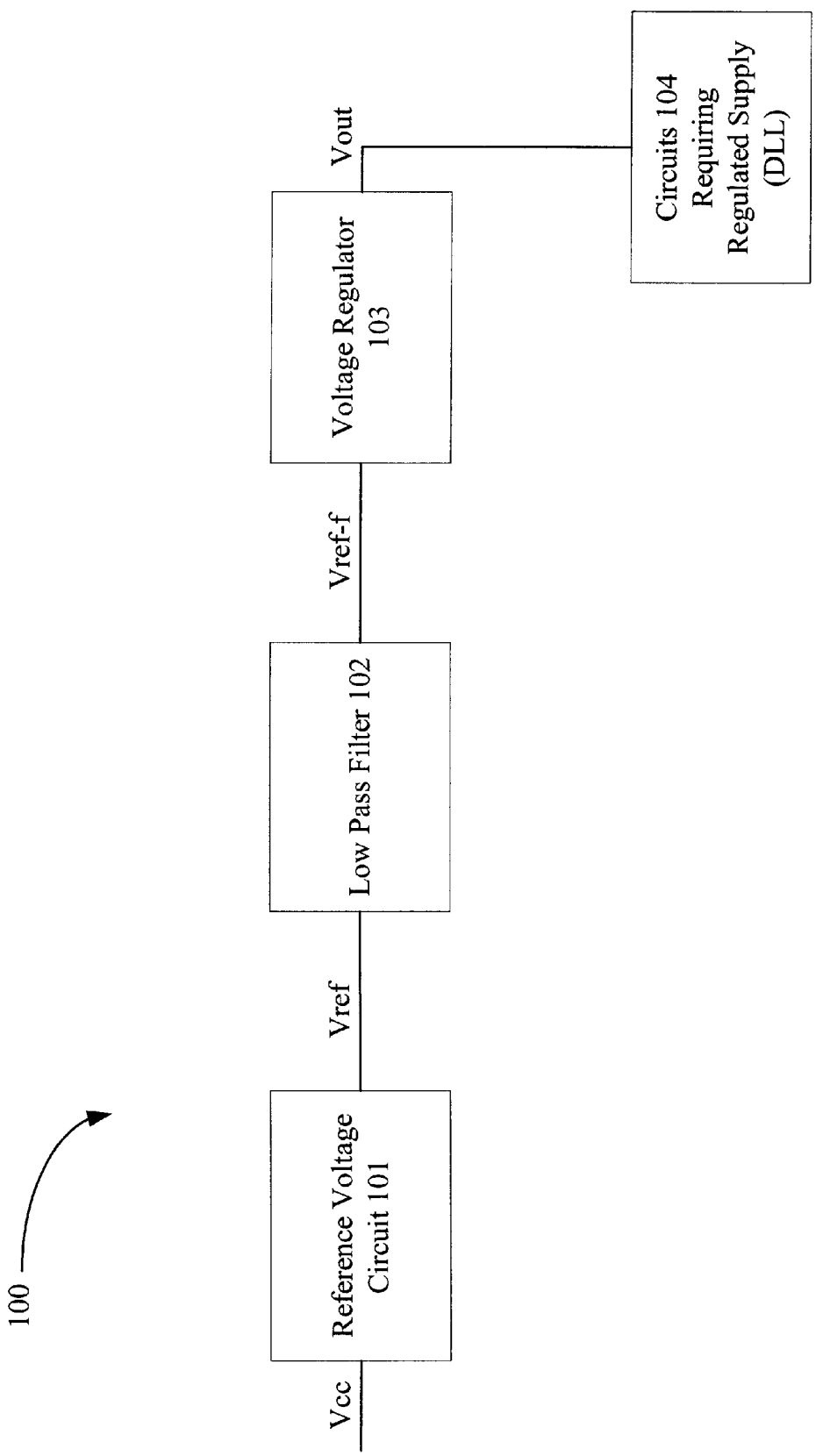
FIG. 1 is a block drawing illustrating one use for a low pass filter of the present invention.

FIG. 1 illustrates a system 100 for providing a regulated voltage Vout to the internal circuits 104 of an integrated circuit. In accordance with the present invention and described in more detail below, system 100 includes a low pass filter 102 that minimizes abrupt changes in a reference voltage Vref and thus provides a significantly more constant regulated voltage Vout.

Figure 4:
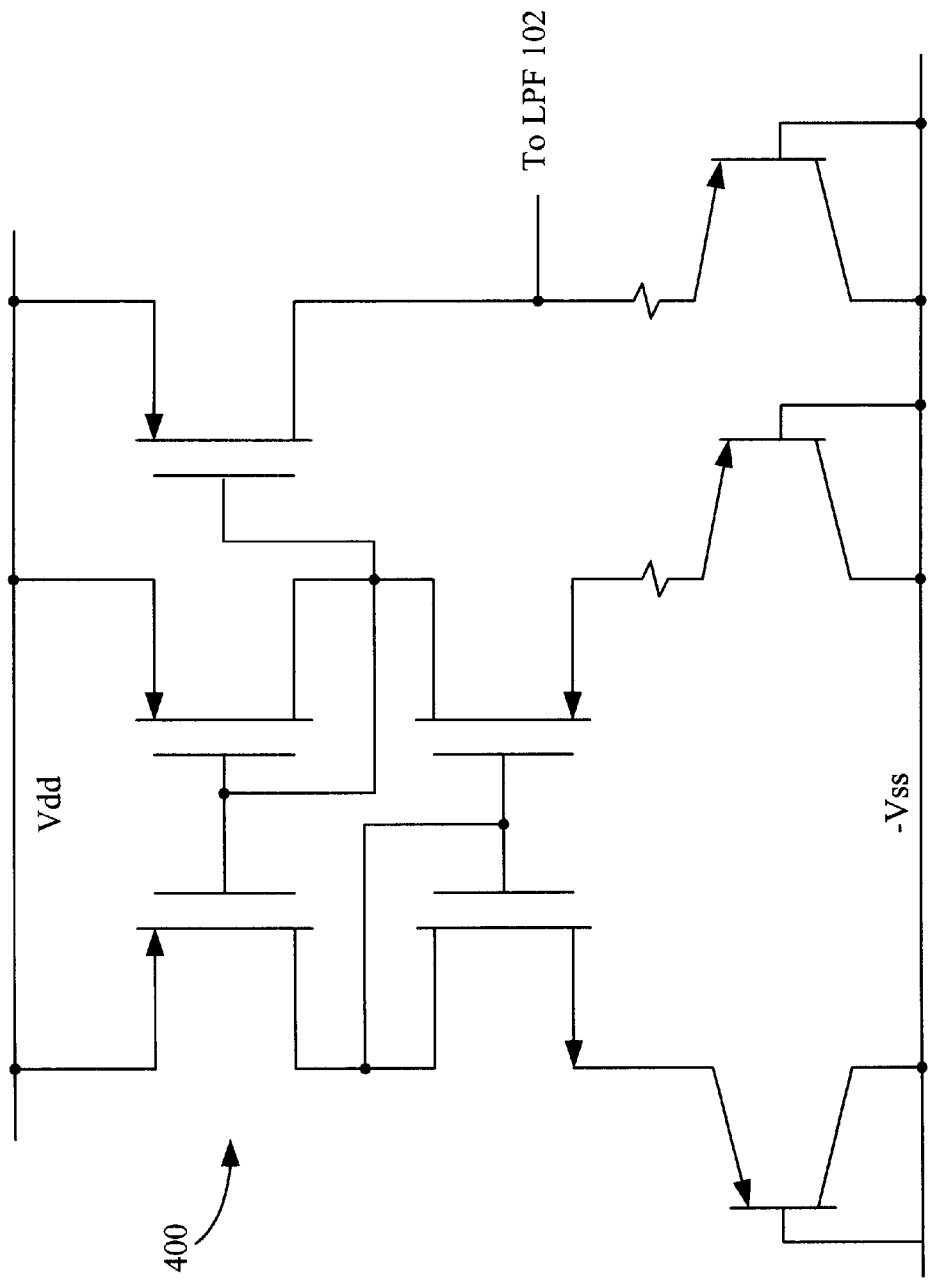
FIG. 4 is a circuit diagram of a conventional reference voltage circuit.

In system 100, a reference voltage circuit 101 receives a supply voltage Vcc from a global power rail (not shown) and generates a reference voltage Vref. FIG. 4 illustrates a conventional reference voltage (bandgap) circuit 400 that may be used with the present invention. The functioning of reference voltage circuit 400 is well known in the art, and so is not discussed here in detail. For additional discussion of reference voltage circuits, see pages 736–737 of "Analysis and Design of Analog Integrated Circuits, Second Edition", by Paul R. Gray and Robert G. Meyer, published 1984, available from John Wiley & Sons, which are incorporated by reference herein.

In general, voltage Vcc varies over time. Specifically, voltage Vcc may "step" from one voltage to another voltage. Reference voltage Vref is a function of supply voltage Vcc. Thus, reference voltage Vref also steps from one voltage to another voltage in response to a step in voltage Vcc. For example, if supply voltage Vcc steps from 2.3 to 2.7V, then reference voltage Vref may step from 1.2 to 1.23V.

Regulated voltage Vout is a function of its input voltage. For example, if the input voltage to voltage regulator 103 steps from 1.2 to 1.23V, then regulated voltage Vout may step from 2.0 to 2.05V. Although apparently a small variation, if such a step occurs rapidly, then the performance of circuits 104, such as the above-mentioned DLL, may be significantly and adversely affected. Most circuits 104 can withstand voltage variations as long as the voltage transition occurs slowly.

Figure 5:
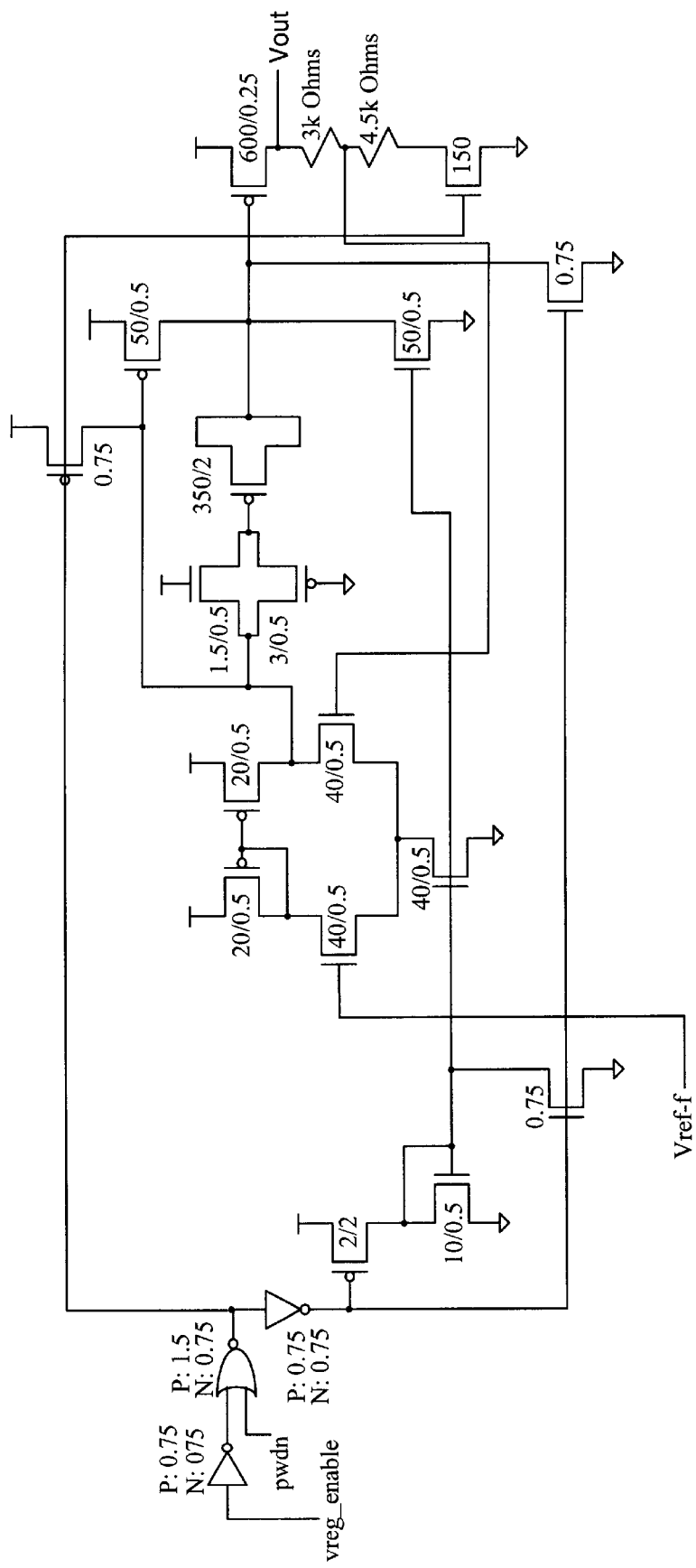
FIG. 5 is a circuit diagram of a conventional voltage regulator.

FIG. 5 illustrates a conventional voltage regulator 500 that may be used with the present invention to provide a 2.0V output. The functioning of voltage regulator 500 is well known in the art, and so is not discussed here in detail. For a discussion of voltage regulators, see pages 307–312 of "The Art of Electronics, Second Edition", by Paul Horowitz and Winfield Hill, published 1989, available from the Cambridge University Press, which are incorporated by reference herein.

Figure 2:
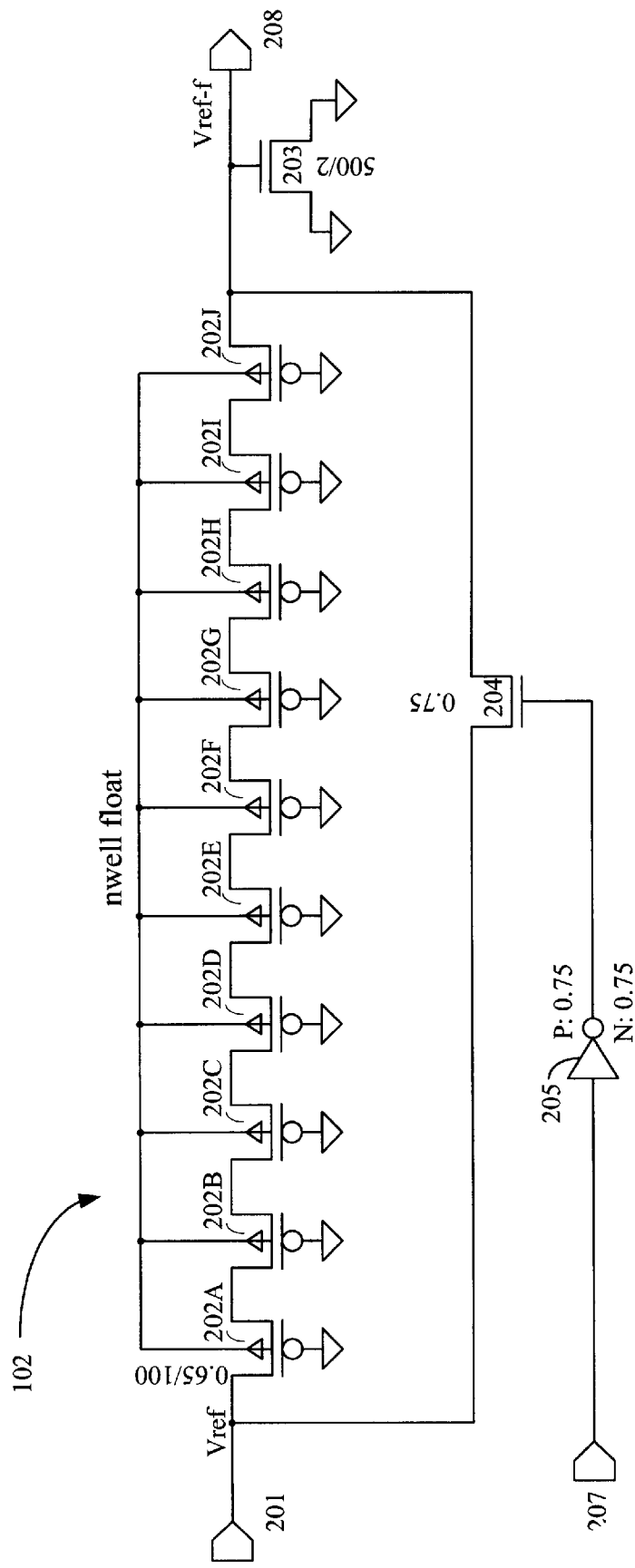
FIG. 2 is a circuit diagram of the low pass filter shown in FIG. 1.

In accordance with the present invention, a low pass filter (LPF) 102 smooths and slows any change in reference voltage Vref, thereby eliminating any abrupt change in regulated voltage Vout. An LPF typically includes two main elements: a resistor and a capacitor. FIG. 2 is a circuit diagram of one embodiment of LPF 102.

In LPF 102, a plurality of series-connected PMOS transistors 202A–202J form the resistor. The gates of PMOS transistors 202 are coupled to ground, and therefore these transistors are conducting. An NMOS transistor 203 having its source and drain tied to ground forms a capacitor. NMOS transistor 203 is coupled to the series-connected PMOS transistors 202 to form the RC circuit which implements LPF 102.

In the prior art, PMOS transistors have their nwells connected to a fixed potential (i.e. supply voltage Vcc). Therefore, if a step in supply voltage Vcc occurs using a prior art LPF, then the nwell of the plurality of series-connected PMOS transistors would follow that voltage step. Because of the significant capacitance through the PMOS channel to the nwell, those devices in turn would quickly follow the new nwell voltage. Thus, having a conventional LPF defeats the purpose of present invention, i.e. to significantly smooth and slow any change in the voltage provided to voltage regulator 103.

Note that if the resistor of an LPF is formed with NMOS transistors, instead of the PMOS transistors of the present invention, then the gates of the NMOS transistors would be coupled to supply voltage Vcc (the series-connected transistors must be conducting). Therefore, similar to the conventional PMOS transistors, the functioning of the LPF including NMOS transistors would be adversely affected by any step in supply voltage Vcc due to coupling through gate capacitance.

Of importance, PMOS transistors 202 are fabricated in a floating nwell. In other words, the nwell is not coupled to the supply voltage Vcc. Because the nwell of LPF 102 is floating, the present invention eliminates any capacitive coupling between voltage supply Vcc and the nwell. It logically follows that a variation in supply voltage fails to affect adversely the functioning of PMOS transistors 202 in LPF 102. Thus, LPF 102 performs its intended purpose, i.e. to smooth and significantly slow any change in reference voltage Vref.

As known by those skilled in the art, there is a parasitic capacitor formed between the nwell and the substrate. Thus, the nwell is indirectly coupled to ground. However, this indirect coupling to ground has no effect on the performance of LPF 102.

In another embodiment of the present invention, the resistor of the LPF is implemented with a single PMOS transistor instead of series-connected PMOS transistors 202. To replace series-connected PMOS transistors 202, the single PMOS transistor is fabricated in a floating nwell, has its gate coupled to ground, and has a size of 0.65/1000. Note that although the functioning of this single PMOS transistor is identical to that of series-connected PMOS transistors 202, a plurality of PMOS transistors provides more flexibility in layout.

Figure 3:
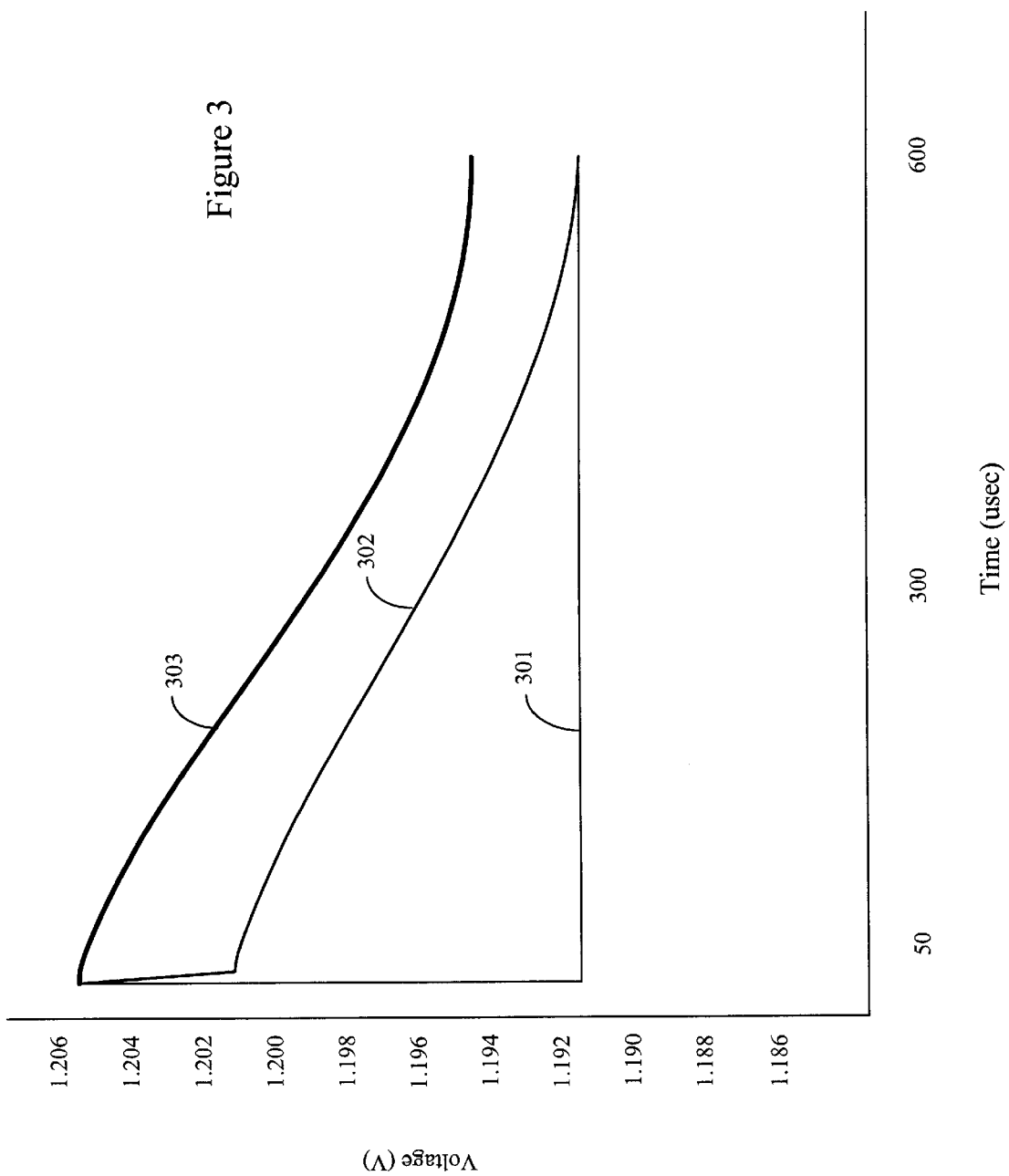
FIG. 3 is a graph showing a reference voltage and two filtered reference voltages over time.

FIG. 3 illustrates a graph of a reference voltage provided to LPF 102, a filtered reference voltage output by a prior art LPF, and a filtered reference voltage output by LPF 102. In FIG. 3, the reference voltage, shown by line 301, is a step from 1.2055V to 1.1913V which occurs in approximately 100 nanoseconds. An illustrative filtered reference voltage output by a prior art LPF, shown by line 302, demonstrates that a significant percentage of the reference voltage step appears at the output of this LPF during the transition time. In contrast, the filtered reference voltage output by LPF 102, shown by line 303, smoothes the abrupt steps and significantly slows the voltage transition of the reference voltage to over 1 millisecond (only 600 microseconds shown in FIG. 3). In this manner, voltage regulator 103 (FIG. 1), which receives the filtered reference voltage of LPF 102, in turn provides a significantly more constant regulated voltage to internal circuits 104.

In one embodiment of the present invention, the source and drain terminals of a bypass transistor 204 are coupled to either side of series-connected PMOS transistors 202. In this manner, when signal 207 goes active at power-up (in this embodiment a logic zero), bypass transistor 204 is turned on, thereby allowing voltage regulator 103 to see immediately reference voltage Vref on input terminal 201. After power-up is completed, signal 207 goes inactive (logic one), thereby turning off transistor 204 and ensuring LPF 102 filters reference voltage Vref.

The sensitivity of circuits 104, such as the above-mentioned DLL, to voltage variations determines the maximum allowable rate of change of regulated voltage Vout. For example, for one embodiment of a DLL to maintain lock, the change in regulated voltage Vout must not cause the delay through the DLL delay line to change more than one trim delay (approximately 35 picoseconds) in the maximum possible time between trim adjustments (30 microseconds, for the DLL at 25 MHz with highest jitter filter setting). One trim delay is about 0.1% of the total delay through one delay line. Thus, regulated voltage Vout may change approximately 0.1% or 2.0 mV over 30 microseconds.

Because regulated voltage Vout tracks changes in its input voltage, filtered reference voltage Vref–f may change no more than 1.2 mV over 30 us to meet the above-mentioned voltage change requirement for regulated voltage Vout.

Therefore, in accordance with the present invention, LPF 102 insulates regulator 103 from rapid changes in the reference voltage by generating a large time constant. The values of the resistance and the capacitance of LPF 102 determine its time constant. As also known by those skilled in the art, the size and number of PMOS transistors 202 and NMOS transistor 203 determine the resistance and capacitance, respectively. In FIG. 2, each PMOS transistor 202B–202J has the dimensions indicated for PMOS transistor 202A. The dimensions for other transistors of LPF 102 are indicated adjacent those transistors.

The size and number of the transistors of LPF 102 (FIG. 2) provide the appropriate time constant for one embodiment of a DLL to maintain lock. Other embodiments of DLLs or other circuits 104 require a different time constant and thus will use different size and number of transistors. Thus, the detailed information for LPF 102 is illustrative only.

Note that in one embodiment, each circuit 104 has its own LPF 102 and voltage regulator 103. In yet another embodiment, reference voltage Vref, filtered voltage Vref–f, and regulated voltage Vout are distributed via shielded lines to circuits 104, thereby providing further insulation from any adverse influence of voltage supply Vcc.

It is understood that the present invention is not limited to only the embodiments disclosed, but also includes modifications which would be apparent to a person skilled in the art. For example, the reference voltage circuit and voltage generator shown in FIGS. 4 and 5, respectively, are illustrative only. Systems including other reference voltage circuits and voltage regulators which include the low pass filter described herein are still covered by the present invention which is limited only by the following claims.

What is claimed is:

1. A low pass filter having an input terminal and an output terminal, the low pass filter comprising:

at least one PMOS transistor connected between the input terminal and the output terminal, wherein the gate of each PMOS transistor is coupled to ground, further wherein each PMOS transistor is formed in a floating well; and an NMOS transistor having its source and drain coupled to ground, wherein a gate of the NMOS transistor is coupled to the output terminal.

2. The low pass filter of claim 1, further including a bypass transistor having a first terminal coupled to the input terminal, a second terminal coupled to the output terminal, and a third terminal for selectively bypassing the low pass filter.

3. A low pass filter comprising:

a resistor coupled between an input terminal and an output terminal, and formed in a well that is floating with respect to a supply voltage; and a capacitor coupled to the resistor.

4. The low pass filter of claim 3, wherein the resistor includes a plurality of series-connected PMOS transistors, wherein the gates of the PMOS transistors are coupled to ground.

5. The low pass filter of claim 3, wherein the resistor includes one PMOS transistor, wherein the gate of the PMOS transistor is coupled to ground.

6. The low pass filter of claim 3, wherein the capacitor includes an NMOS transistor having a source and a drain coupled to ground, and a gate coupled to the resistor.

7. A system for providing a regulated voltage to an internal circuit of an integrated circuit, the system including:

a reference voltage circuit for receiving a supply voltage and providing a reference voltage;

a low pass filter for receiving the reference voltage and providing a filtered reference voltage, wherein the low pass filter is isolated from the supply voltage; and a voltage regulator for receiving the filtered reference voltage and providing the regulated voltage to the internal circuits.

* * * * *